(12) United States Patent
Banine et al.

(10) Patent No.: US 7,639,418 B2
(45) Date of Patent: *Dec. 29, 2009

(54) MULTI-LAYER SPECTRAL PURITY FILTER, LITHOGRAPHIC APPARATUS INCLUDING SUCH A SPECTRAL PURITY FILTER, DEVICE MANUFACTURING METHOD, AND DEVICE MANUFACTURED THEREBY

(75) Inventors: Vadim Yevgenyevich Banine, Helmond (NL); Johannes Hubertus Josephina Moors, Helmond (NL); Leonid Shmaenok, Nieuwegein (NL); Nikolay Nikolaevitch Salashchenko, Nizhny Novgorod (RU)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 12/073,128

(22) Filed: Feb. 29, 2008

(65) Prior Publication Data
US 2008/0151361 A1 Jun. 26, 2008

Related U.S. Application Data

(63) Continuation of application No. 11/091,923, filed on Mar. 29, 2005, now Pat. No. 7,372,623.

(51) Int. Cl.
*G02B 5/20* (2006.01)
(52) U.S. Cl. .................. 359/360; 359/359; 359/361
(58) Field of Classification Search ......... 359/350–361, 359/577–590, 885–890
See application file for complete search history.

(56) References Cited

U.S. PATENT DOCUMENTS

| | | | |
|---|---|---|---|
| 5,329,569 A * | 7/1994 | Spielman | 378/161 |
| 5,907,436 A | 5/1999 | Perry et al. | |
| 6,014,251 A | 1/2000 | Rosenberg et al. | |
| 6,392,792 B1 | 5/2002 | Naulleau | |
| 6,522,465 B1 | 2/2003 | Goldstein | |
| 6,906,788 B2 | 6/2005 | Bakker et al. | |
| 7,019,906 B2 | 3/2006 | Leu et al. | |
| 7,154,666 B2 | 12/2006 | Wedowski | |
| 7,465,936 B2 * | 12/2008 | Amemiya | 250/374 |
| 2004/0061930 A1 | 4/2004 | Wedowski | |
| 2004/0105083 A1 | 6/2004 | Kurt et al. | |
| 2005/0008818 A1 | 1/2005 | Olszewski et al. | |
| 2005/0040345 A1 | 2/2005 | Bakker et al. | |
| 2005/0157279 A1 * | 7/2005 | Miyachi et al. | 355/30 |
| 2006/0160031 A1 | 7/2006 | Wurm et al. | |

FOREIGN PATENT DOCUMENTS

EP  1 197 803 A2  4/2002

(Continued)

OTHER PUBLICATIONS

English Translation of Japanese Official Action issued on Jan. 27, 2009 in Japanese Application No. 2006-067070.

(Continued)

*Primary Examiner*—Thong Nguyen
(74) *Attorney, Agent, or Firm*—Pillsbury Winthrop Shaw Pittman LLP

(57) ABSTRACT

A multi-layered spectral purity filter improves the spectral purity of extreme ultra-violet (EUV) radiation and also collects debris emitted from a radiation source.

23 Claims, 11 Drawing Sheets

FOREIGN PATENT DOCUMENTS

| | | |
|---|---|---|
| EP | 1 202 117 A1 | 5/2002 |
| EP | 1 331 519 A2 | 7/2003 |
| JP | 2004-524524 A | 8/2004 |
| TW | 565711 B | 12/2003 |
| WO | WO02/059905 A2 * | 8/2002 |
| WO | WO 2005/119365 A2 | 12/2005 |
| WO | WO 2005/119365 A3 | 12/2005 |

OTHER PUBLICATIONS

English Translation of Official Action issued on Apr. 28, 2009 in Taiwanese Application No. 097122239.

RD 500051, "Resist Spectral Filter System for Extreme Ultraviolet Projection Lithography," Research Disclosure, vol. 500, Dec. 10, 2005, p. 1432.

Powell et al., "Filter windows for EUV lithography", Emerging Lithographic Technologies V, Proceeding of SPIE, vol. 4343 pp. 585-589 (2001).

* cited by examiner

Nb/Si (1, )
Mo/Si (2, o)
Zr/Si (Δ)
Mo/C (•)

Absolute Transmission wavelength

410

MULTI-LAYER SPECTRAL PURITY FILTER, LITHOGRAPHIC APPARATUS INCLUDING SUCH A SPECTRAL PURITY FILTER, DEVICE MANUFACTURING METHOD, AND DEVICE MANUFACTURED THEREBY

CROSS REFERENCE TO RELATED APPLICATIONS

This application is a continuation of U.S. application Ser. No. 11/091,923, filed Mar. 29, 2005, now U.S. Pat. No. 7,372,623, the entire content of which is incorporated herein by reference.

FIELD

The present invention relates to a lithographic apparatus and a method of using the apparatus in the manufacture of a device such as an integrated circuit (IC). In particular, the present invention relates to multi-layered spectral purity filters which improve the spectral purity of an extreme ultra-violet (EUV) radiation beam and also filter debris emitted from a radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In addition to EUV radiation, an EUV source emits many different wavelengths of radiation and debris. This non-EUV radiation is harmful for an EUV lithography system, so it has to be removed by, for example, a spectral purity filter. Present spectral purity filters are based on blazed gratings. However, these gratings are difficult to produce, since the surface quality of a triangular shaped pattern on the spectral purity filters has to be very high. The roughness of the surface should be lower than 1 nm RMS.

Debris mitigation schemes may be applied for suppressing debris emitted from radiation sources. However, commonly used debris mitigation methods, which include foil traps and gas buffers, do not guarantee effective debris protection. Moreover, use of standard (e.g. Zr) thin filters transmissive for EUV is virtually impossible due to the fragility of the filters and low heat-load threshold.

Debris mitigation schemes may also involve physical removal of components from a lithographic apparatus and their off-line cleaning using chemical processes. However, having to accommodate such off-line cleaning makes vacuum and mechanical design of a lithographic apparatus extremely complicated. Off-line cleaning also involves a significant amount of down time for the lithographic apparatus.

A further problem of existing spectral purity filters is that they change the direction of a radiation beam from an EUV source. Therefore, if a spectral purity filter is removed from an EUV lithography apparatus, a replacement spectral purity filter has to be added or a mirror at a required angle has to introduced. The added mirror introduces unwanted losses into the system.

SUMMARY

It is an aspect of the present invention to provide a spectral purity filter which is capable of mitigating debris emitted from a radiation source and also improving the spectral purity of a radiation beam.

According to an embodiment of the present invention there is provided a lithographic spectral purity filter including a multi-layered structure of alternating layers, wherein the spectral purity filter is configured to enhance the spectral purity of a radiation beam by reflecting or absorbing undesired radiation, the spectral purity filter also being configured to collect debris emitted from a radiation source, wherein there are about 10 to 100 alternating layers that form the multi-layered structure.

Undesired radiation may be defined as radiation which has a different wavelength from desired radiation of the radiation beam, which may for example be EUV radiation. The undesired radiation, which may be reflected or absorbed, may have wavelengths which are larger or smaller than the desired radiation of the radiation beam.

The spectral purity filter may suppress undesired radiation while transmitting desired radiation with low wavelengths, such as EUV radiation. The multi-layered structure may therefore be designed and adapted to reflect or absorb undesired radiation (e.g. deep ultra-violet (DUV) radiation) while transmitting desired radiation (e.g. extreme ultra-violet (EUV) radiation).

The spectral purity filter of the present invention may be classified as a transmissive filter. The spectral purity filter may have a transmission of at least 40%, at least 60%, at least 80% and preferably at least 90% for desired radiation such as EUV radiation.

The spectral purity filter may filter out undesired radiation, such as DUV radiation. For example, on the transmission of radiation through the spectral purity filter, the ratio of EUV radiation to DUV radiation may be enhanced by about 100 times, 1000 times or even up to about $10^5$ times. A significant improvement in the spectral purity of a radiation beam on transmission through a spectral purity filter according to the present invention may therefore be obtained.

The multi-layered structure of the spectral purity filter may have about 2-200 alternating layers, about 10-100 alternating layers, or about 20-50 alternating layers. The alternating layers may have a thickness of about 0.2 to 100 nm, about 0.2 to 20 nm, or about 0.5 to 5 nm. Each of the alternating layers may form continuous layers of substantially constant thickness. The total thickness of the multi-layered structure of alternating layers may range from about 10 to 700 nm and preferably about 100 to 200 nm.

The multi-layered structure of alternating layers may be formed from any suitable number of different alternating layers. For example, there may be two different layers which alternate with one another. Alternatively, there may be three different layers which alternate with one another.

The alternating layers forming the multi-layered structure may be formed from a combination of any of the following: Zr and Si layers; Zr and $B_4C$ layers; Mo and Si layers; Cr and Sc layers; Mo and C layers; and Nb and Si layers. The spectral purity filter including the multi-layered structure of alternating layers may be formed by depositing alternating layers of, for example, Zr and Si, using any suitable technique such as magnetron sputtering, epitaxy, ion sputtering and e-beam evaporation with or without ion polishing.

The multi-layered structure of the spectral purity filter may be designed to be strong and robust so that the filter is not damaged by debris emitted from a radiation source.

The multi-layered structure of alternating layers may be deposited onto a mesh-like structure. The mesh-like structure may be in the form of a honeycomb structure and may penetrate from one side of the multi-layered structure to the other. The mesh-like structure may include a plurality of apertures within which material forming the multi-layered structure of alternating layers may be deposited. The mesh may be formed from any suitable electroformable material, for example Ni and Cu. The apertures in the mesh-like structure may have a size range of about 0.01-5 $mm^2$, for example about 1-1.5 $mm^2$. The mesh-like structure may improve the strength of the multi-layered structure in the spectral purity filter. The spectral purity filter may therefore be made of a thinner multi-layered structure in comparison to spectral purity filters without a mesh. This may improve the transmission of EUV radiation. A spectral purity filter including a mesh-like structure may therefore be substantially strengthened and may withstand greater pressure differences in comparison to filters with no mesh-like structure.

Spectral purity filters according to the present invention with a total thickness of about 50-600 nm including a mesh-like structure penetrating from one side of the filter to the other and with apertures of about 1 $mm^2$, and with a total surface area of about 1 $cm^2$ may withstand pressure differences of up to about 0.5-1 bar.

A mesh-like structure may be placed adjacent to one side only of the alternating layers of the multi-layered structure. A mesh-like structure may be placed adjacent both sides of the alternating layers of the multi-layered structure. In these embodiments, the mesh-like structure does not penetrate into the alternating layers.

A mesh-like structure may partially penetrate into the alternating layers of the multi-layered structure.

There may be no mesh-like structure. Spectral purity filters according to the present invention with a total thickness of about 50-600 nm and not including a mesh-like structure, and with a total surface area of about 1 $cm^2$, may withstand pressure differences of up to about 0.1 mbar.

The spectral purity filters of the present invention may withstand a heat flux up to about 6 $W/cm^2$ and even higher. In addition, the spectral purity filters may withstand temperatures of up to about 500° C. and even higher, such as up to 1000° C. to 1500° C. This is much higher than actually required in a standard lithographic apparatus.

The spectral purity filters according to the present invention may be connected in a modular form allowing large surface areas of up to about 1 to 10 $cm^2$ to be formed by a combination of many spectral purity filters.

The spectral purity filters may be positioned at any point in a lithographic apparatus apart from an intermediate focus of a radiation beam. For example, the spectral purity filters may be positioned in a source-collector-module or in an illumination system of a lithographic apparatus. The spectral purity filter may be positioned downstream of a collector and upstream of an intermediate focus. Where debris mitigation is desirable, the spectral purity filter may be positioned upstream of a collector in a lithographic apparatus. Where the spectral purity filter is to be used mainly for spectral filtering, then the spectral purity may be positioned downstream of a collector such as at any of the following positions: between an intermediate focus of a radiation beam and an incidence reflector; between an incidence reflector and a mask table; or above a substrate table.

The spectral purity filter according to the present invention is also capable of filtering and mitigating debris emitted from a radiation source. The debris emitted from a radiation source may be atomic particles, micro-particles and ions. The spectral purity filters according to the present invention may be used in combination with other debris suppression devices such as foil traps, background gas pressure systems, electromagnetic suppressors and any other suitable devices.

The spectral purity filters may also be easily removed from a lithographic apparatus, and then cleaned externally and repositioned in the lithographic apparatus, or substituted with a replacement spectral purity filter. By easy replacement of the spectral purity filter, this overcomes the need to disassemble a substantial part of a lithographic apparatus. The spectral purity filter of the present invention therefore has cost benefits in comparison to spectral purity filters existing in the prior art.

According to a further embodiment of the present invention there is provided a lithographic apparatus including: an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein a spectral purity filter including a multi-layered structure of alternating layers is configured to enhance the spectral purity of the radiation beam by reflecting or absorbing undesired radiation, the spectral purity filter also being configured to collect debris emitted from a radiation source, wherein there are about 10 to 100 alternating layers that form the multi-layered structure.

The spectral purity filter may be positioned in a source-collector-module or an illumination system of the lithographic apparatus. The spectral purity filter may be positioned downstream of a collector and upstream of an intermediate focus of the radiation beam.

According to a yet further embodiment of the present invention there is provided a lithographic apparatus including a spectral purity filter including a multi-layered structure of alternating layers, wherein the spectral purity filter is configured to enhance the spectral purity of a radiation beam by reflecting or absorbing undesired radiation, the spectral purity filter also being configured to collect debris emitted from a radiation source, wherein there are about 10 to 100 alternating layers that form the multi-layered structure.

According to a further embodiment of the present invention there is provided a device manufacturing method including providing a conditioned radiation beam using an illumination system; imparting a pattern to the radiation beam; projecting the patterned beam of radiation onto a target portion of the substrate; wherein a spectral purity filter including a multi-layered structure of alternating layers is configured to enhance the spectral purity of the radiation beam by reflecting or absorbing undesired radiation, the spectral purity filter also being configured to collect debris emitted from a radiation source, wherein there are about 10 to 100 alternating layers that form the multi-layered structure.

According to a further embodiment of the present invention there is provided a device manufacturing method including projecting a patterned beam of radiation onto a substrate, wherein a spectral purity filter including a multi-layered structure of alternating layers is configured to enhance the spectral purity of the radiation beam by reflecting or absorbing undesired radiation, the spectral purity filter also being configured to collect debris emitted from a radiation source, wherein there are about 10 to 100 alternating layers that form the multi-layered structure.

According to a further embodiment of the present invention there is provided a device manufactured according to a method described above.

The manufactured device may, for example, be an integrated circuit (IC), an integrated optical system, a guidance and detection pattern for magnetic domain memories, a liquid crystal display (LCDs) and a thin-film magnetic head.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
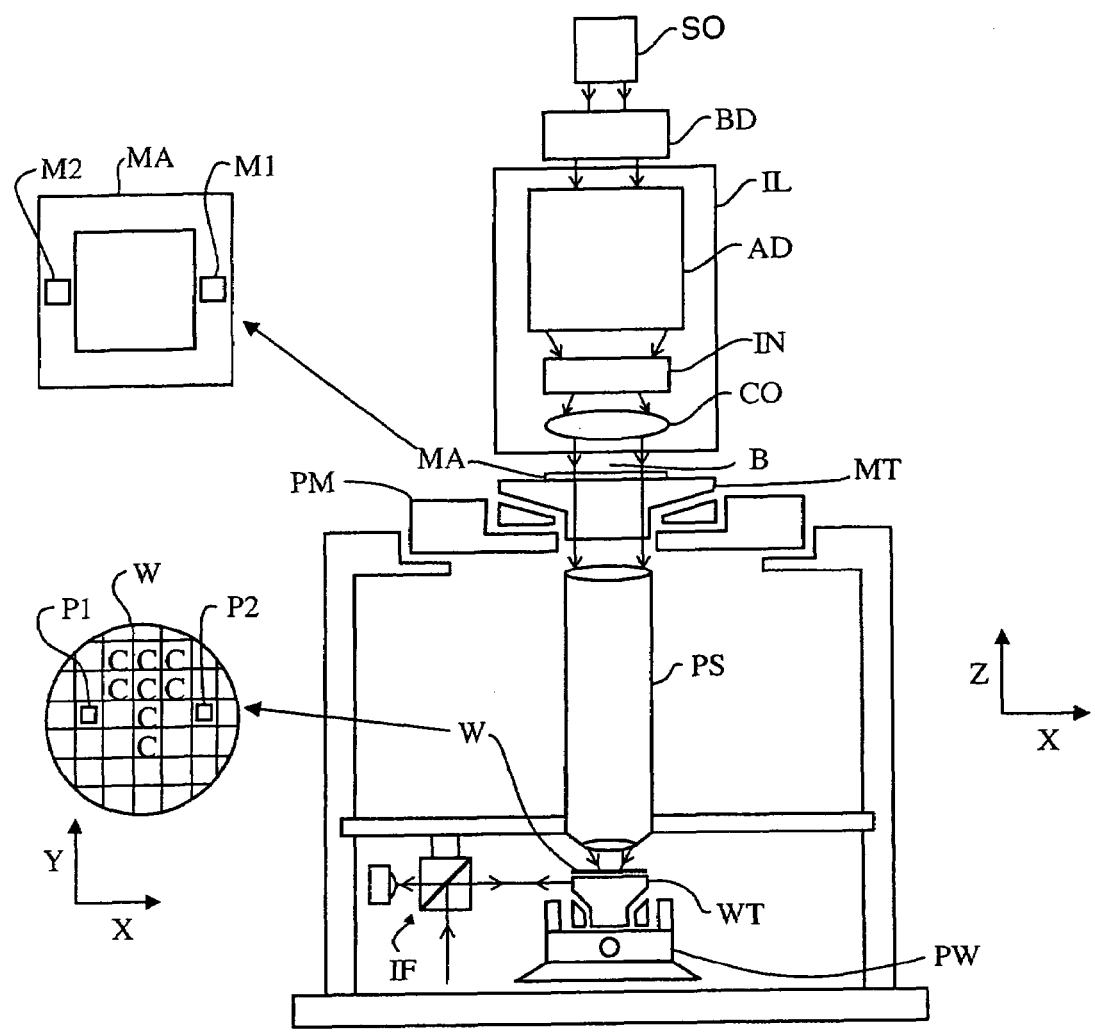
FIG. 1 schematically depicts a lithographic apparatus according to an embodiment of the present invention.

FIG. 1 schematically depicts a lithographic apparatus including an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern radiation beam B onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held by the support (e.g., mask table MT), and is patterned by the patterning device. Having traversed the mask MA, the radiation beam B passes through the projection system PS, which projects the beam onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
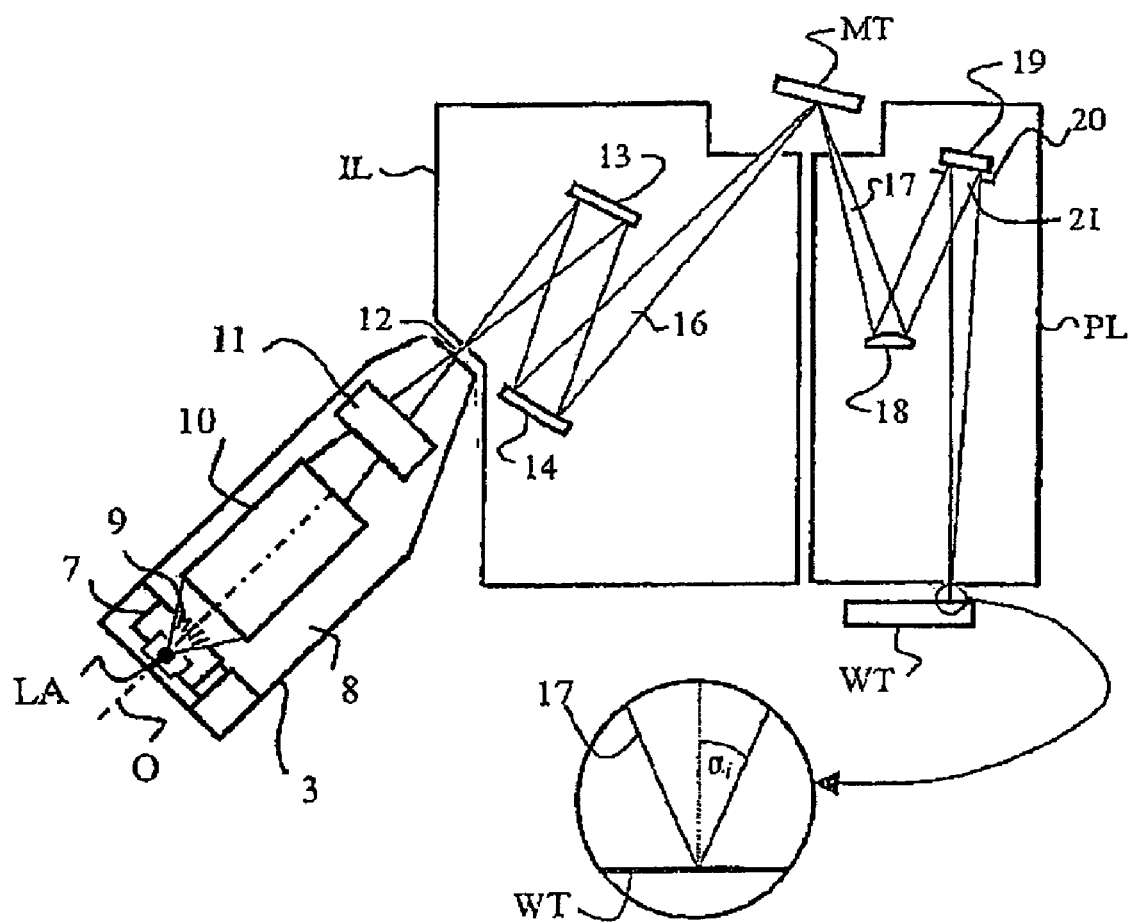
FIG. 2 schematically depicts a lithographic apparatus according to another embodiment of the present invention.

FIG. 2 shows a side view of an EUV lithographic apparatus in accordance with an embodiment of the present invention. It will be noted that, although the arrangement is different to that of the apparatus shown in FIG. 1, the principle of operation is similar. The apparatus includes a source-collector-module or radiation unit 3, an illumination system IL and a projection system PL. Radiation unit 3 is provided with a radiation source LA which may employ a gas or vapor, for example Xe gas or Li vapor, in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of 0.1 m bar of Xe, Li vapor or any other suitable gas or vapor may be required for efficient generation of the radiation. The radiation emitted by radiation source LA is passed from the source chamber 7 into collector chamber 8 via a gas barrier or foil trap 9. The gas barrier includes a channel structure. The collector chamber 8 includes a radiation collector 10 which is formed, for example, by a grazing incidence collector. Radiation passed by collector 10 transmits through a spectral purity filter 11 according to the present invention. It should be noted that in contrast to blazed spectral purity filters, the spectral purity filter 11 does not change the direction of the radiation beam. The radiation is focused in a virtual source point 12 (i.e. an intermediate focus) from an aperture in the collection chamber 8. From chamber 8, the beam of radiation 16 is reflected in illumination system IL via normal incidence reflectors 13, 14 onto a reticle or mask positioned on reticle or mask table MT. A patterned beam 17 is formed which is projected by projection system PL via reflective elements 18, 19 onto wafer stage or substrate table WT. More elements than shown may generally be present in the illumination system IL and projection system PL.

One of the reflective elements 19 has in front of it an NA disc 20 having an aperture 21 therethrough. The size of the aperture 21 determines the angle as subtended by the radiation beam 17 as it strikes the substrate table WT.

FIG. 2 shows the spectral purity filter 11 according to the present invention positioned downstream of the collector 10 and upstream of the virtual source point 12. In alternative embodiments to that shown in FIG. 2, if the spectral purity filter 11 according to the present invention is mainly to be used for mitigating debris emitted from radiation source LA, then the spectral purity filter 11 is placed between the gas barrier or foil trap 9 and the collector 10. In other embodiments, where the spectral purity filter 11 is mainly to be used for spectral filtering, then the spectral purity filter 11 may be placed at any of the following positions: between the collector 10 and the virtual source point 12 (i.e. the intermediate focus); between the virtual source point 12 and incidence reflector 13; between incidence reflector 13 and incidence reflector 14; between incidence reflector 14 and the mask table MT; and above the substrate table WT.

Figure 3:
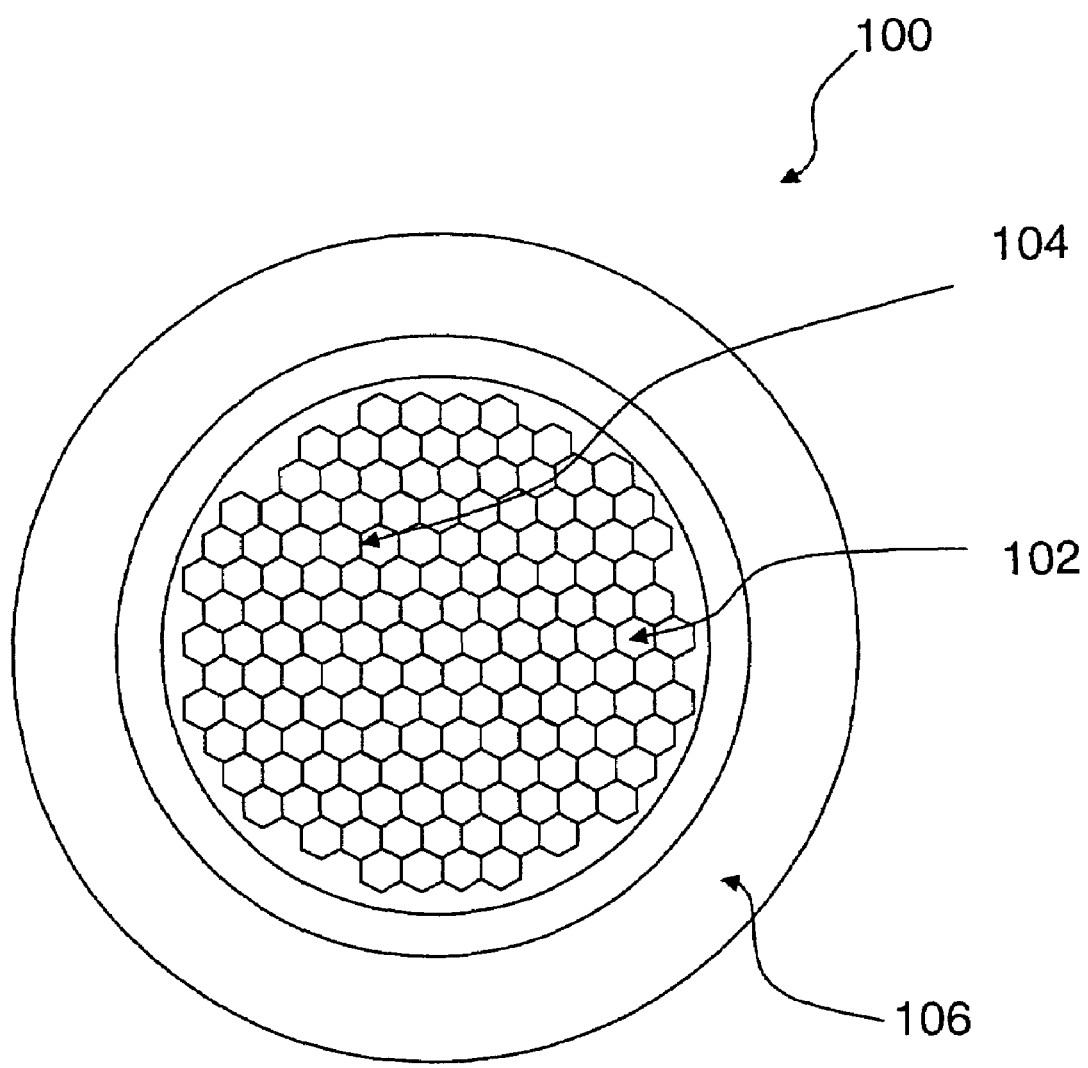
FIG. 3 schematically depicts a spectral purity filter according to an embodiment of the present invention.

FIG. 3 depicts a spectral purity filter 100 according to an embodiment of the present invention. Spectral purity filter 100 has a multi-layered structure formed by 50 alternating Zr/Si layers 102. Alternative embodiments may have between 2-200 alternating Zr/Si layers 102.

The spectral purity filter 100 also includes a mesh 104. The mesh 104 is made of Cu and forms a honeycomb structure including substantially hexagonal shaped apertures with a size of about 1-1.5 mm². The mesh 104 penetrates from one side to the other side of the alternating Zr/Si layers 102. In alternative embodiments, meshes 104 may be placed adjacent to one side only or on both sides of the Zr/Si layers 102, or may partially penetrate into the Zr/Si layers 102.

The mesh 104 enhances the integral strength of the Zr/Si layers 102.

The Zr/Si layers 102 are mounted in a substantially annular shaped base 106. The shape of the annular shaped base 106 facilitates the incorporation of the spectral purity filter 100 into a lithographic apparatus. Spectral purity filter 100 is therefore easy to handle.

The Zr/Si layers 102 are designed to be substantially robust. For example, Zr/Si layers 102 as shown in FIG. 3 with a mesh and with a total thickness of about 200 nm and a surface area of 1 cm² can withstand pressure differences up to 0.5-1 bar.

Figure 4:
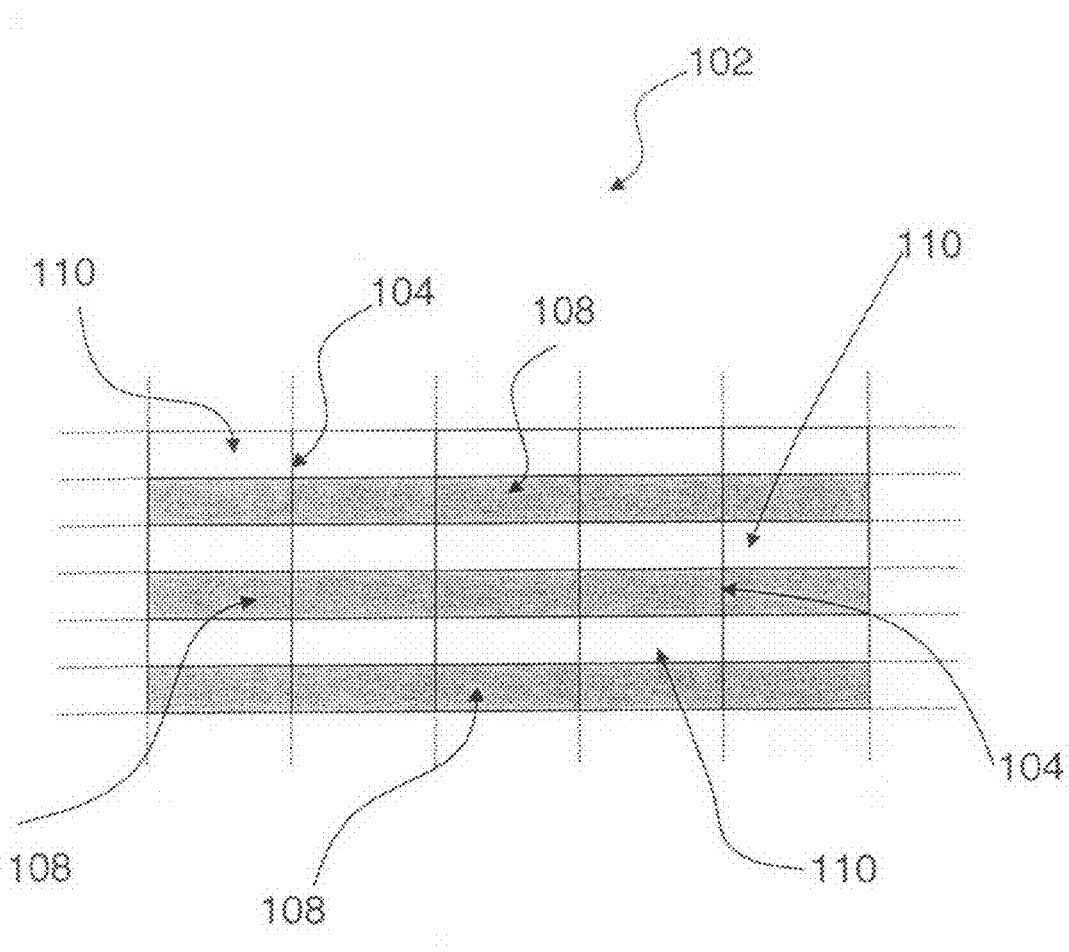
FIG. 4 schematically depicts a cross-section of part of the spectral purity filter shown in FIG. 3.

FIG. 4 shows a cross-section of part of the spectral purity filter 100 shown in FIG. 3. In FIG. 4, the thickness of the Zr layers 108 is about 1 nm and the thickness of the Si layers 110 is about 3 nm. FIG. 4 shows the mesh 104 extending through the Zr/Si layers 102. In alternative embodiments, although not shown, the thicknesses of the Zr/Si layers 102 may be variable. Although not fully shown in FIG. 4 there may be 50 alternating layers of Zr and Si.

Figure 5:
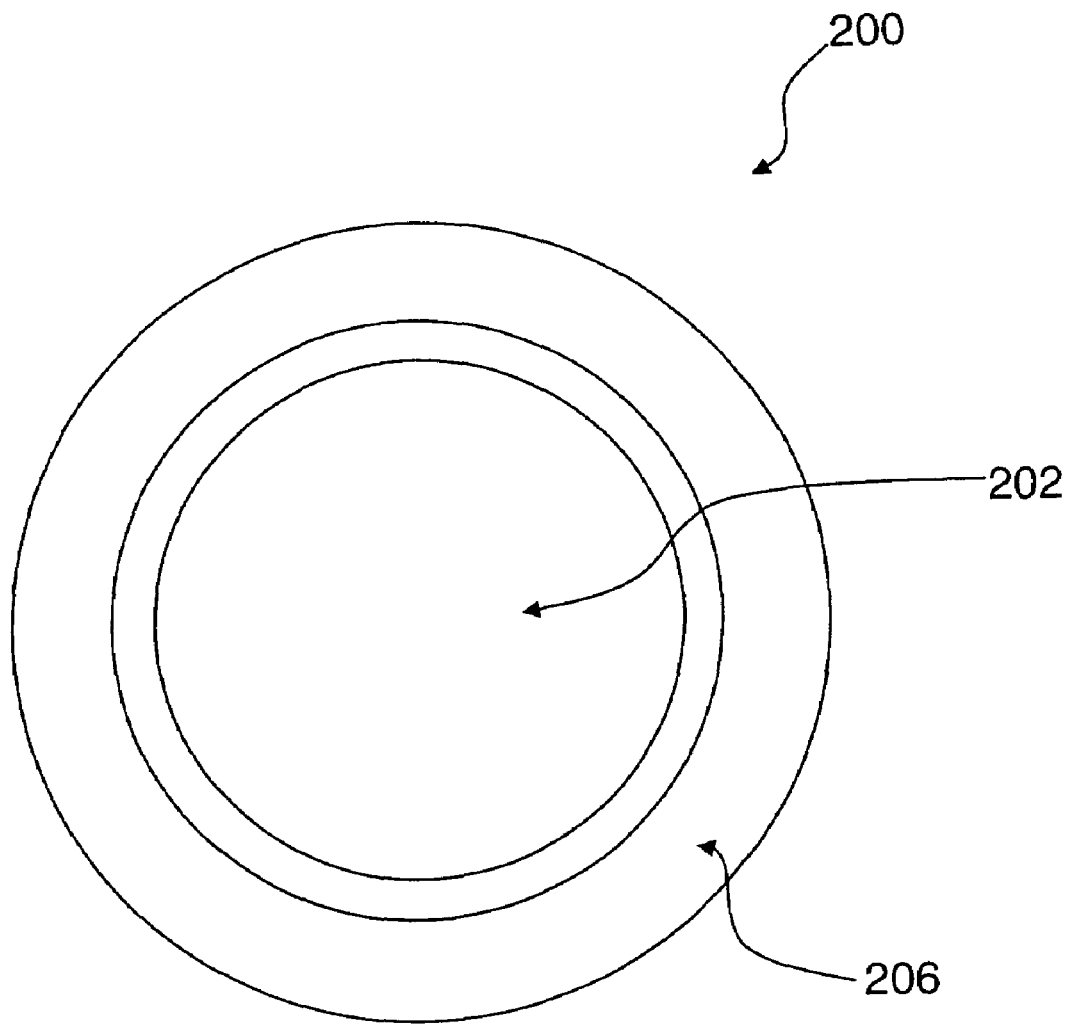
FIG. 5 schematically depicts a spectral purity filter according to another embodiment of the present invention.

FIG. 5 depicts a spectral purity filter 200 according to an embodiment of the present invention. A multi-layer structure formed by alternating Zr/Si layers 202 mounted in a substantially annular shaped base 206. In contrast to the spectral purity filter 100 shown in FIGS. 3 and 4 there is no mesh. As there is no mesh, the Zr/Si layers 202 are not as strong as the Zr/Si layers 102. For example, Zr/Si layers 202 with a total thickness of 200 nm and a surface area of 1 cm² can withstand pressure differences of only about 0.1 m bar.

Figure 6:
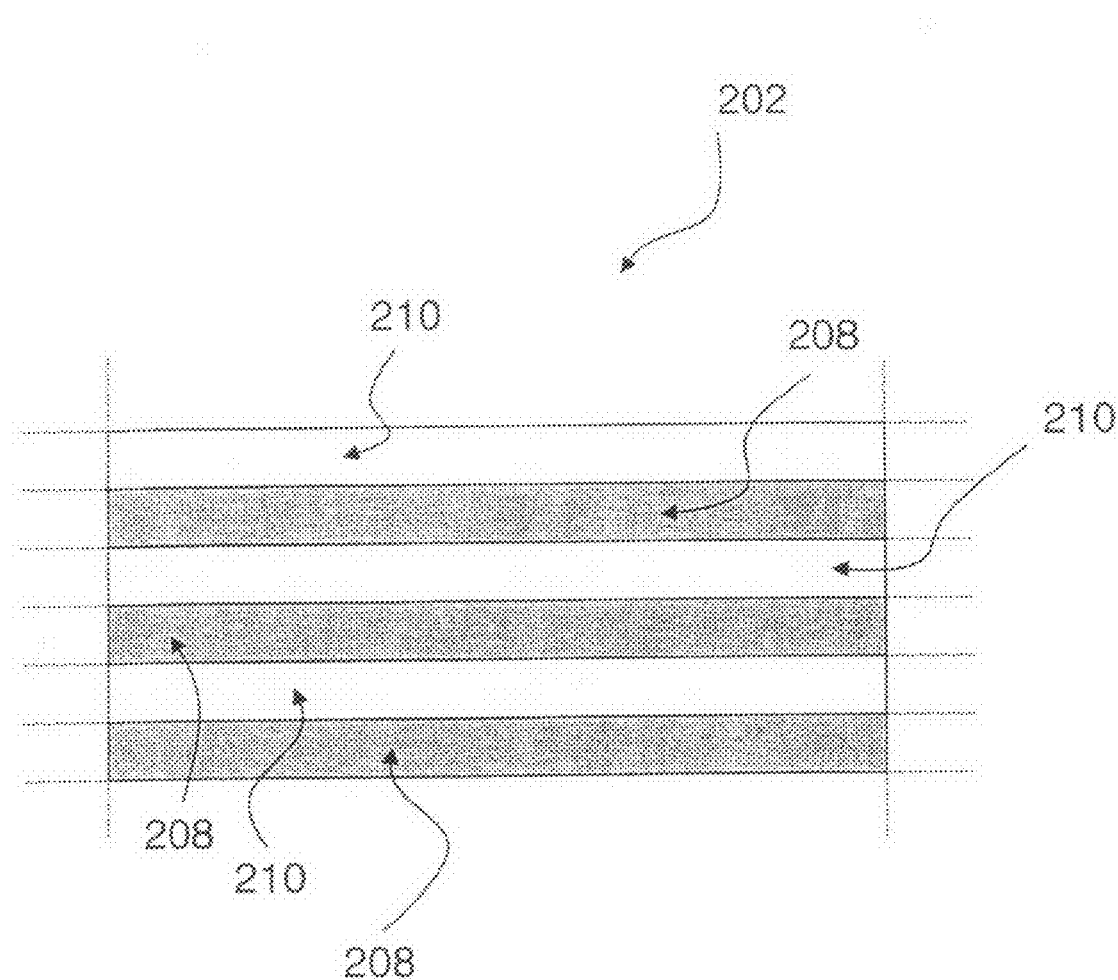
FIG. 6 schematically depicts a cross-section of part of the spectral purity filter shown in FIG. 5.

FIG. 6 is a cross-section of part of spectral purity filter 200 shown in FIG. 5. In FIG. 6, the thickness of the Zr layers 208 is about 1 nm and the thickness of the Si layers 210 is about 3 nm. In alternative embodiments, although not shown, the thickness of the Zr/Si layers 202 may be variable. Although not fully shown on FIG. 6, there may be 50 alternating layers of Zr and Si.

Unlike prior art spectral purity filters, the spectral purity filters 100, 200 are easily mountable in a lithographic apparatus and may also be easily removed. Additionally, although not shown, the spectral purity filters 100, 200 may be made in a modular form and may therefore form any required surface area for a spectral purity filter.

Using the spectral purity filters 100, 200 shown in FIGS. 3 to 6, effective filtering of DUV is obtainable. The spectral purity filters 100, 100 usually have only about a 20% light loss with up to about a 100×10⁵ in EUV to DUV ratio.

In addition, the spectral purity filters 100, 200 according to the present invention mitigate debris such as atomic particles, micro-particles and ions emitted produced from a radiation source.

Table 1 below shows a variety of spectral purity filters according to the present invention.

TABLE 1

| Structure | D (nm) | d(1)/d | N | h (nm) | d(mm) | ΔP(bar) |
|---|---|---|---|---|---|---|
| Zr | | | 65 | 200 | 6 | 0.12 |
| Zr/Si | 3.9 | 0.75 | 30 | 120 | 6 | 0.12 |
| Zr/Si | 3.9 | 0.75 | 65 | 255 | 6 | 0.42 |
| Zr/Si | 3.5 | 0.85 | 75 | 260 | 6 | 0.40 |
| Zr/Si | 2.0 | 0.75 | 130 | 260 | 6 | 0.56 |
| Zr/B₄C | 4.0 | 0.75 | 60 | 240 | 6 | 0.18 |
| Mo/Si | 3.7 | 0.70 | 70 | 260 | 5 | 0.52 |
| Zr/Si on Mesh | 3.9 | 0.75 | 65 | 255 | 12 | 0.45 |
| Cr/Sc | 3.2 | 0.47 | 200 | 635 | 6 | 0.47 |
| Cr/Sc | 3.2 | 0.47 | 150 | 480 | 7 | 0.17 |

Table 1 shows a variety of parameters for the spectral purity filters. In Table 1, the parameters referred to are as follows: d(nm) is the thickness of two alternating layers; d(1)/d is the ratio of the thickness of the two alternating layers; N is the number of alternating layers; h(nm) is the total thickness of the alternating layers; d(mm) is the diameter of the spectral purity filter; and ΔP(bar) is the pressure difference which the spectral purity filter can withstand. It is worth noting that the Zr/Si on mesh filter has a relatively large diameter of 12 mm but is still able to withstand pressure differences of up to 0.45 bar. The mesh therefore adds further strength to the filter.

Figure 7:
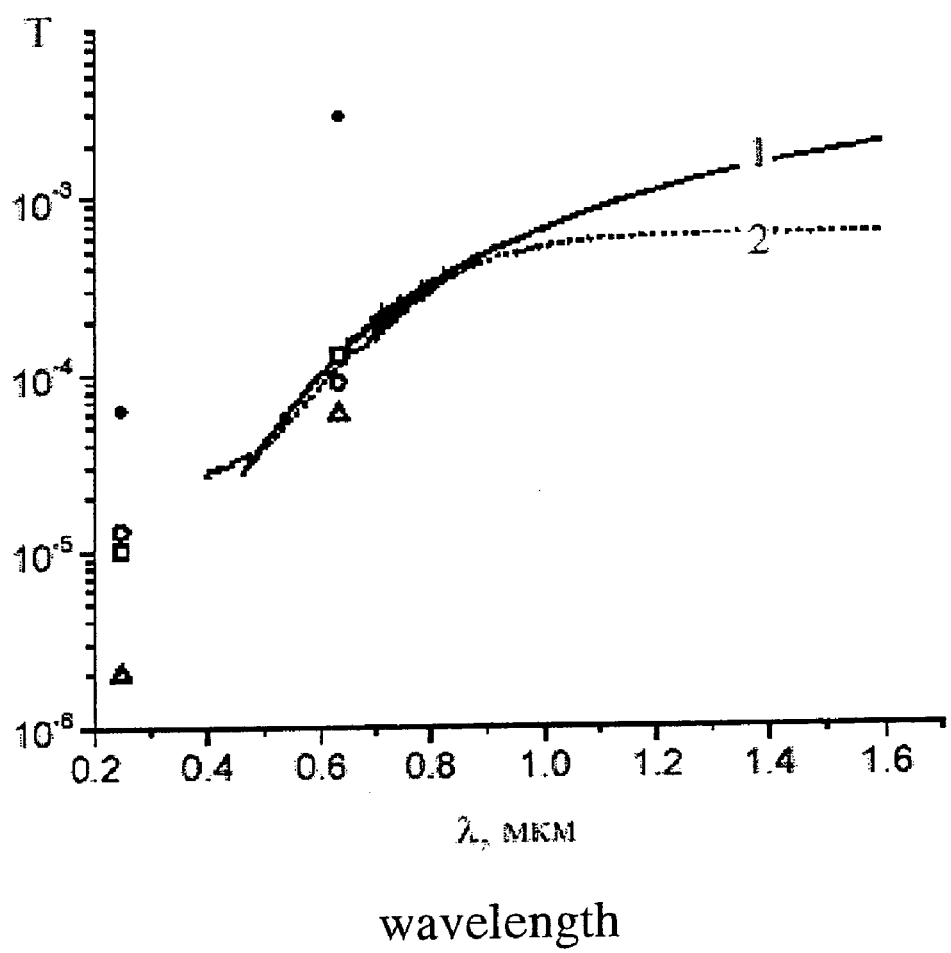
FIG. 7 represents calculated and measured transmission values for spectral purity filters according to embodiments of the present invention.

FIG. 7 relates to calculated and measured spectral transmission values for filters according to the present invention. In particular, FIG. 7 shows the high DUV-UV-IR suppression by filters according to the present invention. FIG. 7 represents absolute transmission (T) versus wavelength (λ) of radiation. The plotted points are actual values with the curves being calculated. Each of the spectral purity filters has a structure including a mesh as shown in FIGS. 3 and 4 and has a total thickness of about 200 nm. For the Nb/Si filter, the Nb has a thickness of about 3-4 nm and the Si has a thickness of about 0.5-1 nm. For the Mo/Si filter, the Mo has a thickness of about 3-4 nm and the Si has a thickness of about 0.5-1 nm. For the Zr/Si filter, the Zr has a thickness of about 3-4 nm and the Si has a thickness of about 0.5-1 nm. For the Mo/C filter, the Mo has a thickness of about 3-4 nm and the C has a thickness of about 0.5-1 nm.

To examine the performance and reliability of spectral purity filters according to the present invention a number of experiments were performed. These are discussed below.

A. Cold Experiment

Figure 8:
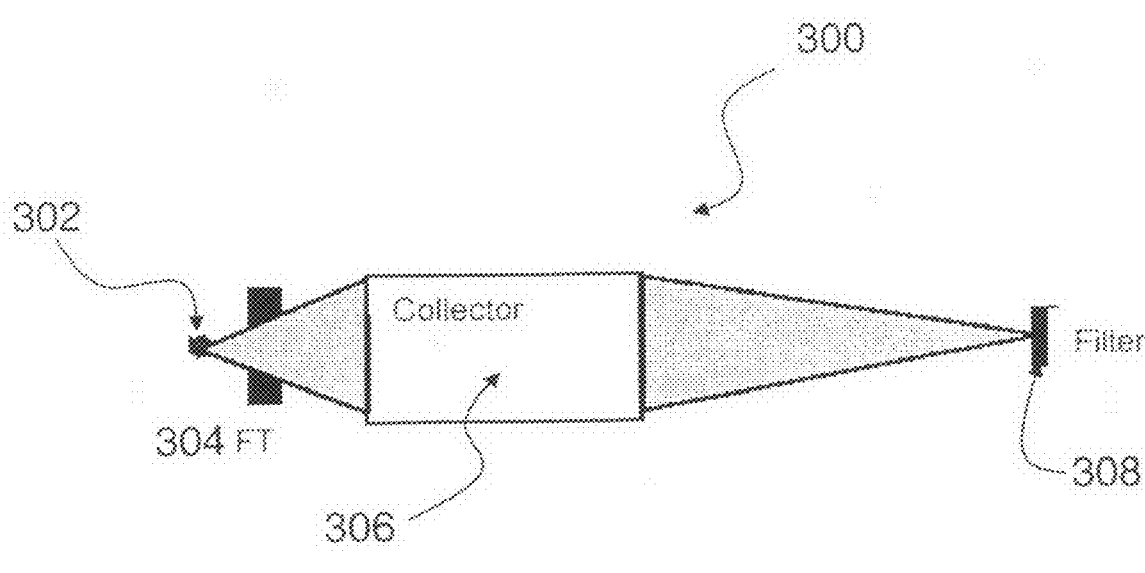
FIG. 8 schematically depicts an apparatus in which properties of a spectral purity filter according to an embodiment of the present invention are measured.

The apparatus 300 shown in FIG. 8 was used in a cold experiment. The apparatus 300 includes a source 302, a foil trap (FT) 304, a collector 306 and a Zr/Si spectral purity filter 308 according to the present invention. The source 302 is a Xe source and is used to check the spectral purity filter 308 for resistance to high heat and EUV loads.

The experiment was performed while the spectral purity filter 308 remained relatively cold due to good conductive cooling of a mount (not shown). The spectral purity filter 308 was placed in an intermediate focus of the collector 306.

The spectral purity filter 308 is a Zr/Si filter as shown in FIGS. 3 and 4 with 50 alternating layers of Zr and Si and a total thickness of 200 nm. A mesh also penetrates from one side of the Zr/Si alternating layers to the other.

The experimental conditions are shown below in Table 2.

TABLE 2

| Number of shots | 5.5 M shot |
|---|---|
| Flux | 2 W/cm$^2$ |
| Repetition Rate | 600 Hz |
| Spot Size | 12 mm |

The result of the experiment was that no additional damage was observed on the spectral purity filter 308 after 5.5 M shots.

B. Hot Experiment

Figure 9:
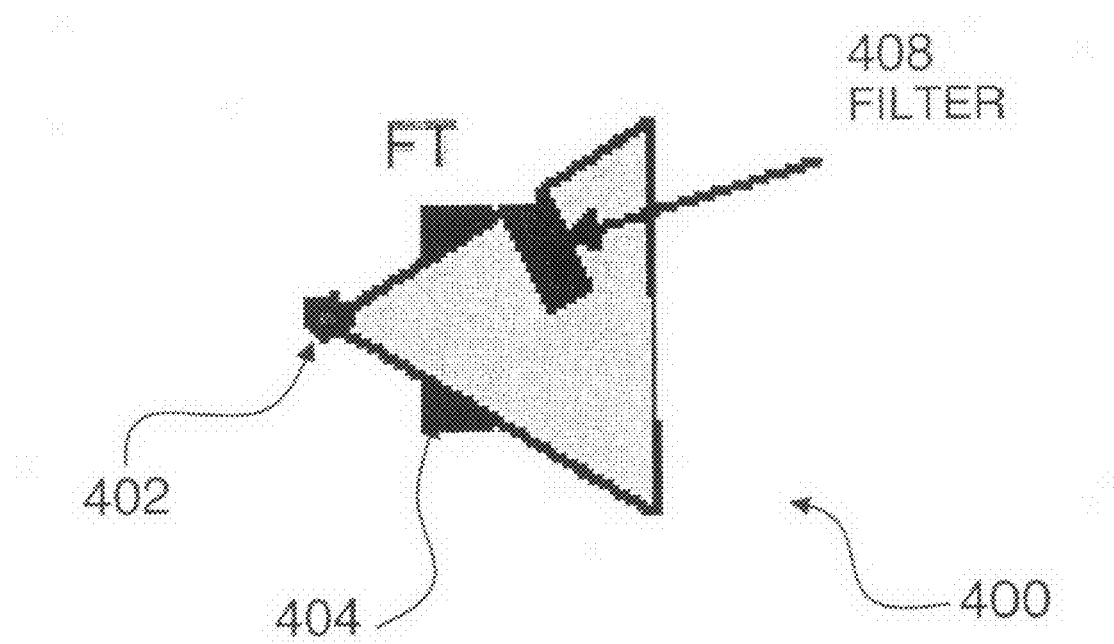
FIG. 9 schematically depicts another apparatus in which properties of a spectral purity filter according to an embodiment of the present invention are measured.

FIG. 9 relates to apparatus 400 for conducting a hot experiment. The apparatus 400 includes a Xe source 402, a FT 404 and a Zr/Si spectral purity filter 408 as used in the cold experiment.

As shown in FIG. 9, the spectral purity filter 408 is mounted as thermally isolated as possible [1 cm×1 mm pin] in order to reach as high a temperature as possible.

The temperature of the spectral purity filter 408 was measured with a thermocouple pyrometer.

Table 3 shown below shows three tests performed using the hot experiment.

TABLE 3

| | Test 1 | Test 2 | Test 3 |
|---|---|---|---|
| Number of shots (M shot) | 1.44 | 1.3 | 1.1 |
| Flux (W/cm$^2$) | 1.1 | 2.2 | 3.5 |
| Repetition Rate of Source (Hz) | 300 | 600 | 954 |
| Spot Size (mm) | 12 | 12 | 12 |
| Mount/filter temperature, max (° C.) | 187 | 270 | 340 |

It was found that the spectral purity filter 408 according to the present invention withstood the conditions of the experiment well. Some holes in the spectral purity filter 408 which had already existed, developed into a hole the size of the cell in the honeycomb structure of the mesh which had aperture sizes of about 1-1.5 mm$^2$.

Figure 10A:
FIGS. 10a-10d depict exposed and unexposed parts of a spectral purity filter according to an embodiment of the present invention.
Figure 10B:
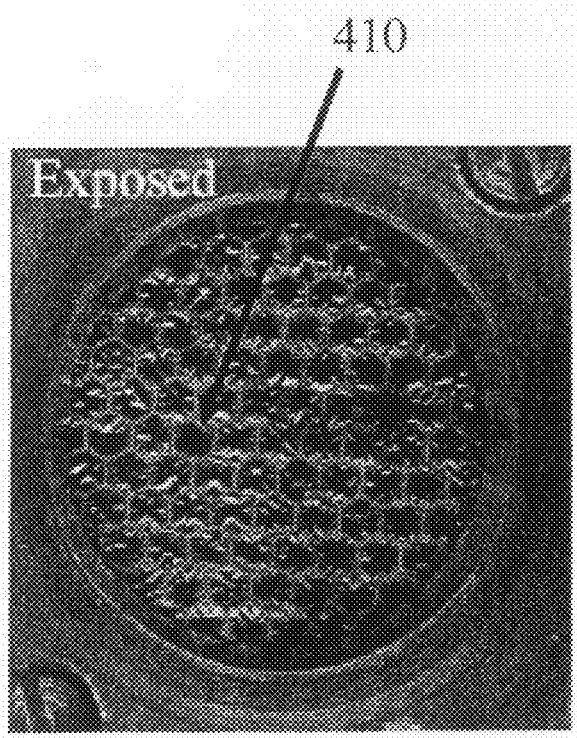
Figure 10C:
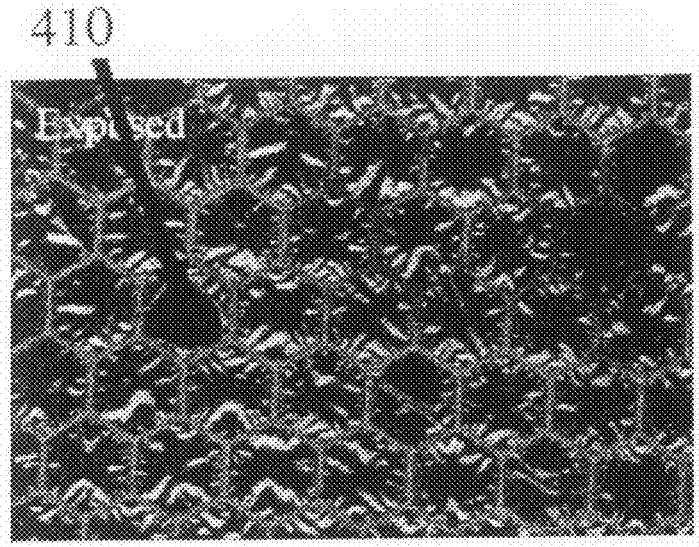
Figure 10D:
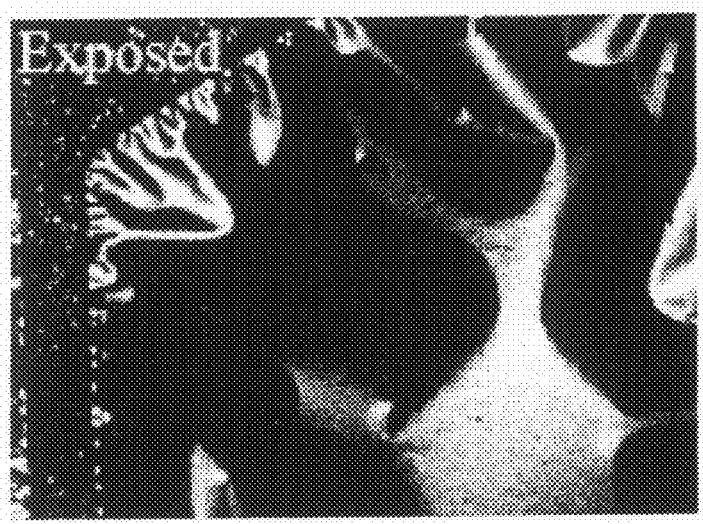

FIG. 10a shows a surface of the spectral purity filter 408 not yet exposed to radiation in the hot experiments. In contrast, FIGS. 10b-10d show a number of representations of the spectral purity filter 408 once exposed to the hot experimental conditions. FIGS. 10c and 10d are enlarged views of FIG. 10b. It can be observed from FIGS. 10b-10d that although holes 410 may be formed in the spectral purity filter 408 of about the same size of the cells in the honeycomb structure of the mesh i.e. 1 mm$^2$, larger holes did not form. This shows that the mesh in the spectral purity filter 408 supported and strengthened the Zr/Si layers.

It should be noted that the cold and hot experiments conducted above, were performed with a Xe source, meaning that the conditions are more extreme than expected in a standard EUV lithographic apparatus. Moreover, the power per shot is about 2.5 times higher than a standard shot in a lithographic apparatus and thus the momentary heating in a pulse is also much higher than conditions generally used in a lithographic apparatus.

The spectral purity filters as described above may be used in any suitable type of lithographic apparatus. Moreover, the spectral purity filters according to the present invention may be used in combination with at least one grazing incidence mirror in a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the term "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it will be apparent to one skilled in the art that modifications may be made to the present invention as described without departing from the scope of the claims set out below.

Although specific reference may have been made above to the use of embodiments of the invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), X-ray and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the invention may take the form of a computer program containing one or more sequences of machine-readable instructions describing a method as disclosed above, or a

What is claimed is:

1. A lithographic spectral purity filter comprising a multi-layered structure of alternating layers, wherein the spectral purity filter is configured to enhance the spectral purity of a radiation beam by reflecting or absorbing deep ultra-violet radiation and transmitting extreme ultra-violet radiation, said spectral purity filter also being configured to collect debris emitted from a radiation source, wherein there are about 10 to 100 alternating layers of two materials that form the multi-layered structure.

2. A lithographic spectral purity filter according to claim 1, wherein at least 90% of extreme ultra-violet radiation in a radiation beam is capable of being transmitted through the spectral purity filter.

3. A lithographic spectral purity filter according to claim 1, wherein on transmission of a radiation beam through the spectral purity filter, the ratio of extreme ultra-violet radiation to deep ultra-violet radiation is enhanced by up to $10^5$ times.

4. A lithographic spectral purity filter according to claim 1, wherein there are about 20 to 50 alternating layers that form the multi-layered structure.

5. A lithographic spectral purity filter according to claim 1, wherein the thickness of each of the alternating layers forming the multi-layered structure ranges from about 0.5 to 20 nm.

6. A lithographic spectral purity filter according to claim 1, wherein the total thickness of the multi-layered structure of alternating layers ranges from about 10 to 700 nm.

7. A lithographic spectral purity filter according to claim 1, wherein the alternating layers that form the multi-layered structure are formed from a combination of any of the following: Zr and Si layers; Zr and $B_4C$ layers; Mo and Si layers; Cr and Sc layers; Mo and C layers; and Nb and Si layers.

8. A lithographic spectral purity filter according to claim 1, wherein the multi-layered structure of alternating layers has a mesh-like structure embedded therein.

9. A lithographic spectral purity filter according to claim 8, wherein the mesh-like structure is in the form of a honeycomb with a plurality of apertures with a size of about 1 $mm^2$.

10. A lithographic spectral purity filter according to claim 1, wherein the multi-layered structure of alternating layers is supported on one side by a mesh-like structure.

11. A lithographic spectral purity filter according to claim 10, wherein the mesh-like structure is in the form of a honeycomb with a plurality of apertures with a size of about 1 $mm^2$.

12. A lithographic spectral purity filter according to claim 10, wherein the multi-layered structure of alternating layers is supported on both sides by a mesh-like structure.

13. A lithographic spectral purity filter according to claim 12, wherein the mesh-like structure is in the form of a honeycomb with a plurality of apertures with a size of about 1 $mm^2$.

14. A lithographic spectral purity filter according to claim 1, wherein debris capable of being collected from a radiation source is selected from any combination of the following: atomic particles, micro-particles and ions.

15. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate;
a projection system configured to project the patterned radiation beam onto a target portion of the substrate; and
a spectral purity filter comprising a multi-layered structure of alternating layers and configured to enhance the spectral purity of the radiation beam by reflecting or absorbing deep ultra-violet radiation and transmitting extreme ultra-violet radiation, the spectral purity filter also being configured to collect debris emitted from a radiation source, wherein there are about 10 to 100 alternating layers of two materials that form the multi-layered structure.

16. A lithographic apparatus according to claim 15, wherein the spectral purity filter is positioned in a source-collector-module of the lithographic apparatus.

17. A lithographic apparatus according to claim 15, wherein the spectral purity filter is positioned in the illumination system of the lithographic apparatus.

18. A lithographic apparatus according to claim 15, wherein the spectral purity filter is positioned downstream of a collector and upstream of an intermediate focus of the radiation beam.

19. A lithographic apparatus comprising a spectral purity filter including a multi-layered structure of alternating layers, wherein the spectral purity filter is configured to enhance the spectral purity of a radiation beam by reflecting or absorbing deep ultra-violet radiation and transmitting extreme ultra-violet radiation, the spectral purity filter also being configured to collect debris emitted from a radiation source, wherein there are about 10 to 100 alternating layers of two materials that form the multi-layered structure.

20. A device manufacturing method, comprising:
providing a beam of radiation;
patterning the beam of radiation;
projecting a patterned beam of radiation onto a target portion of the substrate; and
enhancing the spectral purity of the beam or radiation by reflecting or absorbing undesired radiation and transmitting desired radiation using a spectral purity filter comprising a multi-layered structure of alternating layers, wherein there are about 10 to 100 alternating layers of two materials that form the multi-layered structure.

21. A device manufacturing method according to claim 20, further comprising:
collecting debris emitted from a radiation source with the spectral purity filter.

22. A device manufactured according to the method of claim 20.

23. A device according to claim 22, wherein the device is an integrated circuit; an integrated optical system; a guidance and detection pattern for magnetic domain memories; a liquid crystal display; or a thin-film magnetic head.

* * * * *